(12) United States Patent
Letzelter

(10) Patent No.: US 9,235,656 B2
(45) Date of Patent: Jan. 12, 2016

(54) DETERMINING A GEOMETRICAL CAD OPERATION

(75) Inventor: Frédéric Letzelter, Longjumeau (FR)

(73) Assignee: Dassault Systemes, Velizy Villacoublay (FR)

(*) Notice: Subject to any disclaimer, the term of this patent is extended or adjusted under 35 U.S.C. 154(b) by 486 days.

(21) Appl. No.: 13/456,999

(22) Filed: Apr. 26, 2012

(65) Prior Publication Data

US 2012/0280983 A1    Nov. 8, 2012

(30) Foreign Application Priority Data

May 6, 2011  (EP) .................................... 11305548

(51) Int. Cl.
*G06T 19/00*      (2011.01)
*G06F 17/50*     (2006.01)
*G06F 3/0488*    (2013.01)

(52) U.S. Cl.
CPC ............ *G06F 17/50* (2013.01); *G06F 3/04883* (2013.01)

(58) Field of Classification Search
USPC .................................................. 345/419, 420
See application file for complete search history.

(56) References Cited

U.S. PATENT DOCUMENTS

| | | | |
|---|---|---|---|
| 5,367,372 A | 11/1994 | DiVita et al. | |
| 5,425,109 A | 6/1995 | Saga et al. | |
| 6,233,351 B1 | 5/2001 | Feeney et al. | |
| 7,099,803 B1 | 8/2006 | Rappoport et al. | |
| 7,248,270 B1 | 7/2007 | Boylan | |
| 7,324,691 B2 | 1/2008 | Li et al. | |
| 7,439,987 B2 | 10/2008 | Boose et al. | |
| 7,613,539 B2 | 11/2009 | Bae et al. | |
| 7,696,998 B2 | 4/2010 | Bae | |
| 8,259,101 B2 * | 9/2012 | Shimada et al. | 345/419 |
| 8,429,174 B2 * | 4/2013 | Ramani et al. | 707/749 |
| 8,773,431 B2 * | 7/2014 | Joshi et al. | 345/420 |
| 8,878,841 B2 | 11/2014 | Letzelter | |
| 8,941,681 B2 | 1/2015 | Letzelter | |
| 9,111,053 B2 | 8/2015 | Letzelter et al. | |
| 2003/0025694 A1 | 2/2003 | Davis | |
| 2004/0249809 A1 | 12/2004 | Ramani et al. | |

(Continued)

FOREIGN PATENT DOCUMENTS

| | | |
|---|---|---|
| WO | WO 2007/098243 A2 | 8/2007 |
| WO | WO 2007/146069 A2 | 12/2007 |
| WO | WO 2008/103775 A2 | 8/2008 |

OTHER PUBLICATIONS

Agrawal, M., et al., "Context Aware 1-14 On-line Diagramming Recognition", *Frontiers in Handwriting Recognition (ICFHR), 2010 International Conference on, IEEE*, pp. 682-687 (2010).

(Continued)

*Primary Examiner* — Kimbinh T Nguyen
(74) *Attorney, Agent, or Firm* — Hamilton, Brook, Smith & Reynolds, P.C.

(57) ABSTRACT

It is provided a computer-implemented method for designing a CAD modeled object. The method comprises displaying at least one three-dimensional parametric shape; user-interacting with the screen; defining on a support at least one stroke corresponding to the user-interacting; selecting a number of the three-dimensional parametric shapes; evaluating a relative position of the stroke with the selected shape; and determining a geometrical CAD operation based on the number and the relative position. Such a method makes the design of a CAD modeled object easier.

13 Claims, 9 Drawing Sheets

(56) References Cited

U.S. PATENT DOCUMENTS

| | | | |
|---|---|---|---|
| 2006/0082571 | A1 | 4/2006 | McDaniel |
| 2007/0276214 | A1 | 11/2007 | Dachille et al. |
| 2008/0036771 | A1* | 2/2008 | Bae .............................. 345/442 |
| 2010/0007664 | A1 | 1/2010 | Cao |
| 2011/0084692 | A1 | 4/2011 | Billeres et al. |
| 2012/0280981 | A1 | 11/2012 | Letzelter |
| 2012/0280982 | A1 | 11/2012 | Letzelter |
| 2012/0280984 | A1 | 11/2012 | Letzelter et al. |
| 2012/0283998 | A1 | 11/2012 | Letzelter |
| 2012/0287121 | A1 | 11/2012 | Hong et al. |

OTHER PUBLICATIONS

Anonymous, "Nemetschek Campus Allplan 2005. Step by 1-14 Step. Advanced 3D", [Online] Retrieved from the Internet URL:http://bim.allplan.si/literatura/2005/Step%20by%20Step%20Allplan%202005%20-%20Advanced%203D.pdf [retrieved on Feb. 3, 2010] (2005) p. 126-p. 140.

Anonymous: "Centroid", Retrieved from the Internet URL:http://en.wikipedia.org/w/index.php?title=Special:Book&bookcmd=download&collection_id=4c6921d7317cbbIb&writer=rl&return_to=Centroid [retrieved on Aug. 23, 2011] pp. 1-14.

Eggli, et al., "Inferring 3D Models from Freehand Sketches and Constraints," *Computer Aided Design*, 29(2): 101-112 (1997).

Igarashi, T., et al., "A Suggestive Interface for 3D Drawing," [Online] Retrieved from the Internet: URL:http://delivery.acm.org/10.1145/1290000/1281531/a20-igarashi.pdf?ip=145.64.134.245&CFID=40190234&CFTOKEN=26502069&_acm_=1314782992_a, pp. 1-9 (2007).

Kara, L.B. and Stahovich, T.F., "An Image-Based, Trainable Symbol Recognizer for Hand-Drawn Sketches," *Computer Graphics*, 29;501-517 (2005).

McCrae, J.P., "Sketch-Based Path Design," pp. I-52 (2008). [Online] Retrieved from the Internet:URL:http://www.dgp. [retrieved on Dec. 19, 2011].

Mohamed, K.A., "Concepts and Solutions for Efficient Handling of the Digital Ink," Retrieved from the Internet:URL:http://www.freidok.uni-freiburg.de/volltexte/7361/pdf/thesis_final_khaireel_a_moharned_Mar_2010.pdf—[retrieved on Dec. 19, 2011]. Abstract Only.

Qin, S. F., et al., "From on-line Sketching to 2D and 3D Geometry: A System Based on Fuzzy Knowledge," Computer Aided Design, 32(14): 851-866 (2000).

Xiangyu, et al., "On-line Graphics Recognition," *Proceedings of the 10th Pacific Conference on Computer Graphics and Applications* (2002).

Zeleznik, R.C., et al., SKETCH: An Interface for Sketching 3D Scenes, *Computer Graphics Proceedings, Annual Conference Series*, 163-169 (1996).

Zhiquan Zhou, et al. "SS-Based Sketch Recognition for Graphics of Traffic Accident," Fuzzy Systems and Knowledge Discovery, 2010 *Seventh International Conference on Fuzzy Systems and Knowledge Discovery, IEEE*, 2558-2562.

European Search Report for 11 30 5545, dated: Aug. 29, 2011.
European Search Report for 11 30 5546, dated: Aug. 25, 2011.
European Search Report for 11 30 5547, dated: Dec. 20, 2011.
European Search Report for 11 30 5548, dated: Sep. 2, 2011.
European Search Report for 11 30 5549, dated: Sep. 9, 2011.

Anonymous, "Bivector", Wikipedia (accessed on May 6, 2011).
Anonymous, "Exterior Algebra", Wikipedia (accessed on Apr. 8, 2011).

Baudel, T., "A Mark Based Interaction Paradigm for Free-Hand Drawing," *LRI, Université de Paris-Sud, CNRS URA 410 France*. (1994).

Brinsmead, D., "A Ribbon With Twist Control.pdf", Duncan's Corner, pp. 1-3 (Feb. 13, 2007).

European Search Report in European Patent Application No. 11305564.4 dated Jan. 26, 2012.

Igarashi, Takeo, et al., "Teddy: A Sketching Interface for 3D Freeform Design", *Computer Graphics Proceedings, SIGGRAPH 99*, pp. 409-416 (Aug. 8, 1999).

Keller, E. "Paint Effects and Toon Shading", Chapter 8, *Mastering Autodesk Maya 2011: Autodesk Official Training Guide*, pp. 417-469 (Sep. 7, 2010).

Keller, E., "Tutorial 4: Paintfx—Plasma Membrane Animation Techniques", pp. 1-21 (Dec. 29, 2009).

Mizuno S., "A Method to Create Sculptures With Chinkin in the Virtual Space", Virtual Systems and Multimedia (VSMM), 2010 16th International Conference on, IEEE, Piscataway, NJ, pp. 215-222 (Oct. 20, 2010).

Olsen L., et al., "Sketch-Based Modelling: A Survey", *Computers and Graphics*, Elsevier, Gb, 33(1):85-103 (Feb. 1, 2009).

* cited by examiner

DETERMINING A GEOMETRICAL CAD OPERATION

RELATED APPLICATION(S)

This application claims priority under 35 U.S.C. §119 or 365 to European Patent Application No. 11305548.7, filed May 6, 2011.

The entire teachings of the above application(s) are incorporated herein by reference.

FIELD OF THE INVENTION

The invention relates to the field of computer programs and systems, and more specifically to a method, system and program for designing a CAD modeled object.

BACKGROUND

A number of systems and programs are offered on the market for the design, the engineering and the manufacturing of objects. CAD is an acronym for Computer-Aided Design, e.g. it relates to software solutions for designing an object. CAE is an acronym for Computer-Aided Engineering, e.g. it relates to software solutions for simulating the physical behavior of a future product. CAM is an acronym for Computer-Aided Manufacturing, e.g. it relates to software solutions for defining manufacturing processes and operations. In such systems, the graphical user interface (GUI) plays an important role as regards the efficiency of the technique. These techniques may be embedded within Product Lifecycle Management (PLM) systems. PLM refers to a business strategy that helps companies to share product data, apply common processes, and leverage corporate knowledge for the development of products from conception to the end of their life, across the concept of extended enterprise.

The PLM solutions provided by Dassault Systemes (under the trademarks CATIA, ENOVIA and DELMIA) provide an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the system delivers an open object model linking products, processes, resources to enable dynamic, knowledge-based product creation and decision support that drives optimized product definition, manufacturing preparation, production and service.

Traditionally, the design of an object to be manufactured undergoes several phases which notably include the "ideation" phase and the "concept" phase. During the ideation phase, a specialist designer, who is a specialist of the technical field, designs a two-dimensional (2D) drawing of the object, typically on a paper with a pen. During the concept phase, a CAD designer, who is familiar with the use of CAD systems, designs a three-dimensional (3D) parametric model corresponding to the 2D drawing. The 3D model contains specifications including parametric functions which allow the ulterior phases necessary to the manufacturing of the object.

At the time being, CAD systems are very complex to use. Indeed, most design operations require many interventions by the user. For example, for a single design operation, the user typically has to select the design operation through an icon or a menu provided by the GUI of the CAD system, select shapes which are already designed, and enter parameters of the operation e.g. in dialog boxes, etc. All these steps are time-consuming for the user. The user may also have difficulties accomplishing all these interventions. For example, the user may hardly find the correct icon, or the user may have no idea of the value of the parameters, or the user may find it hard to select a small shape when the selection has to be done by clicking exactly on the shape with a mouse. One consequence is that the GUIs of current CAD systems are often overloaded with icons. Furthermore, the workflow of the user is often broken as some interventions are always needed. The use of current system has thus low ergonomics and poor user-experience. This all leads to a lack of productivity.

Another consequence of this complexity is that the specialist designer and the CAD designer are most likely two different persons, since it is difficult for the specialist designer to use the CAD system. This implies a necessity for communication in order to smoothly link the "concept" phase to the "ideation". Such communication requires time, and it presents other issues. For example, sometimes the 3D model does not correspond to the 2D drawing well enough and many corrections have to be performed.

Within this context, there is still a need for an improved solution for designing a CAD modeled object.

SUMMARY OF THE INVENTION

According to one aspect, it is therefore provided a computer-implemented method for designing a CAD modeled object. The method comprises displaying at least one three-dimensional parametric shape; user-interacting with the screen; defining on a support at least one stroke corresponding to the user-interacting; selecting a number of the three-dimensional parametric shapes; evaluating a relative position of the stroke with the selected shape; and determining a geometrical CAD operation based on the number and the relative position.

The method may comprise one or more of the following:
- evaluating a relative position comprises determining an intersection between the stroke and the selected shape;
- evaluating a relative position further comprises determining if the intersection is in an extremity portion of the selected shape, determining if the intersection is in an extremity portion of the stroke, determining if a tangent vector of the stroke and a tangent vector of the selected shape at the intersection are collinear, and/or determining if a tangent vector of the stroke and a tangent vector of the selected shape at the intersection have a same sense;
- determining if the intersection is in an extremity portion of the selected shape is followed by determining if the intersection is in an extremity portion of the stroke when the number is 1 and the intersection is not in an extremity portion of the selected shape, determining if a tangent vector of the stroke and a tangent vector of the selected shape at the intersection have a same sense when the number is 1 and the intersection is in an extremity portion of the selected shape, or determining if a tangent vector of the stroke and a tangent vector of the selected shape at the intersection are collinear when the number is 2 and the intersection is not in an extremity portion of the selected shape;
- the operation is one of a cut operation, a translate operation, a rotate operation, an erase operation, an extrapol operation, a chamfer operation, a corner operation, a blend operation, a match operation, or a concaten operation;
- the operation is the cut operation when the number is 1, the intersection is not in an extremity portion of the selected shape, and the intersection is not in an extremity portion of the stroke, one of several operations suggested, wherein the several suggested operations are the translate and the rotate operation, when the number is 1, the intersection is not in an extremity portion of the selected shape, and the intersection is in an extremity portion of the stroke, the erase operation when the number is 1, the intersection is in an extremity portion of the selected shape, and the tangent vector of the stroke and the tangent vector of the selected shape at the intersection have a different sense, the extrapol operation when the number is 1, the intersection is in an extremity portion of the selected shape, and the tangent vector of the stroke and the tangent vector of the selected shape at the intersection have a same sense, the chamfer operation when the number is 2, the intersection is not in an extremity portion of the selected shape, and the tangent vector of the stroke and the tangent vector of the selected shape at the intersection are not collinear, the corner operation when the number is 2, the intersection is not in an extremity portion of the selected shape, and the tangent vector of the stroke and the tangent vector of the selected shape at the intersection are collinear; or one of several operations suggested, wherein the several suggested operations are the blend, the match and the concaten operation, when the number is 2 and the intersection is in an extremity portion of the selected shape;

determining an operation comprises user-selecting one of the several operations suggested based on the number and the relative position;

determining an intersection between the stroke and the selected shape comprises discretizing the stroke into stroke points, and determining shape points by discretizing the shape and then projecting the discretized shape on the support;

the operation is one of a cut operation, a translate operation, a rotate operation, an erase operation, an extrapol operation, a chamfer operation, a corner operation, a blend operation, a match operation, or a concaten operation;

determining an operation comprises user-selecting one of several operations suggested based on the number and the relative position;

determining an intersection between the stroke and the selected shape comprises discretizing the stroke into stroke points, and determining shape points by discretizing the shape and then projecting the discretized shape on the support.

It is further proposed a CAD system comprising a memory for storing three-dimensional parametric shapes; and a graphical user interface coupled with the memory and a processor and suitable for performing the above method.

It is further proposed a computer program comprising instructions for performing the above method.

It is further proposed a computer readable storage medium having recorded thereon the above computer program.

BRIEF DESCRIPTION OF THE DRAWINGS

Embodiments of the invention will now be described, by way of non-limiting example, and in reference to the accompanying drawings, where.

DETAILED DESCRIPTION OF THE INVENTION

Figure 1:
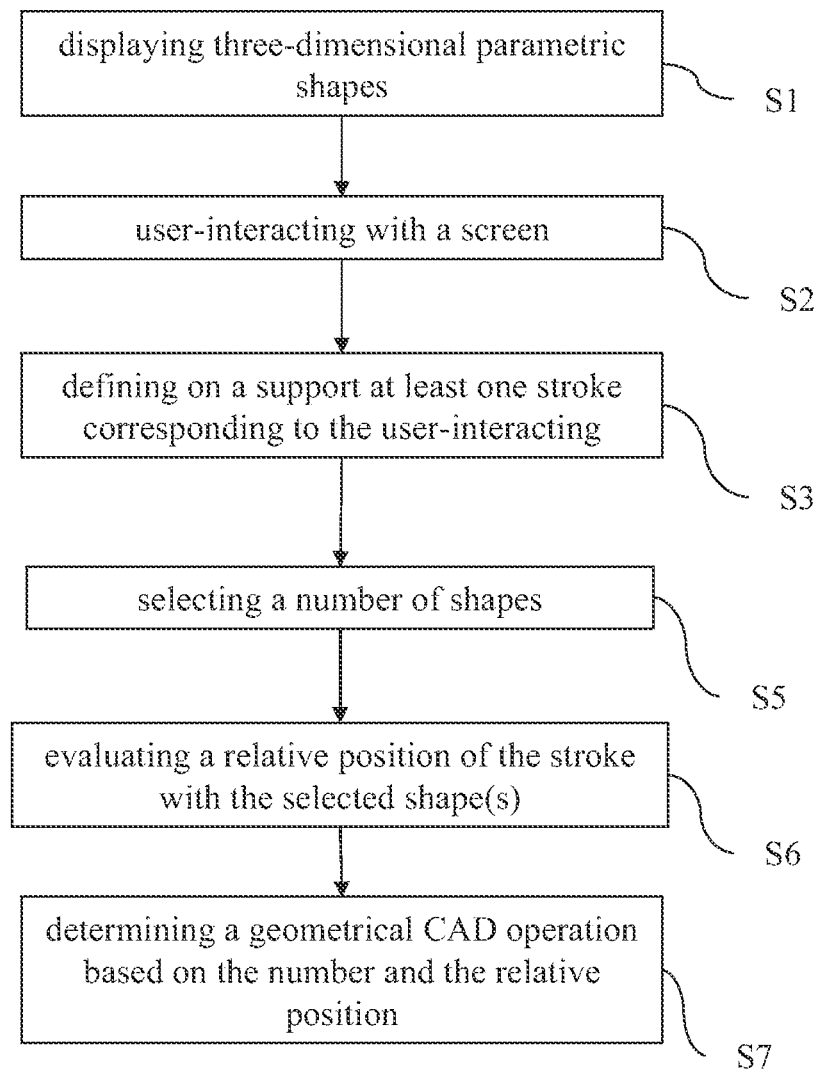
FIG. 1 shows a flowchart of an example of the method.

With reference to the flowchart of FIG. 1, it is proposed a method for designing a CAD modeled object. The method comprises displaying (S1) at least one three-dimensional parametric shape. The method also comprises user-interacting (S2) with a screen. The method also comprises defining (S3) on a support at least one stroke corresponding to the user-interacting. The method also comprises selecting (S5) a number of the three-dimensional parametric shapes. The method also comprises evaluating (S6) a relative position of the stroke with the selected shape. The method then comprises determining (S7) a geometrical CAD operation based on the number and the relative position. Such a method improves the design of a CAD modeled object by making such design easier. Notably, the method makes the determining of a geometrical CAD operation potentially to be performed on the number of shapes easier.

The method is for designing a CAD modeled object. "Designing a CAD modeled object" designates any action or series of actions which is at least part of a process of elaborating a CAD modeled object. Thus, the method may comprise creating the CAD modeled object from scratch. Alternatively, the method may comprise providing a CAD modeled object previously created, and then modifying the CAD modeled object.

The method may be included in a manufacturing process, which comprises, after performing the method, producing a physical product corresponding to the CAD modeled object. Because the method makes the design easier, the method also makes the manufacturing of a product faster and thus increases productivity of the manufacturing process.

The method is computer-implemented. This means that the method is executed on at least one computer, or any system alike. Unless mentioned otherwise, all steps of the method may be performed by the computer, i.e. without intervention of the user. For example, the steps of displaying (S1), defining (S3), evaluating (S6) and determining (S7) may be performed by the computer, whereas the step of user-interacting (S2) is one example of a step where the user intervenes. The step of selecting (S5) may be performed solely by the computer or through user-interaction. Of course, although computer-implemented, the method as a whole may be itself performed upon an intervention of the user, e.g. for triggering the method.

A typical example of computer-implementation of the method is to perform the method with a CAD system comprising a graphical user interface (GUI) suitable for this purpose. The CAD system comprises hardware and the GUI is suitable for performing the method without installing any software. In other words, software is already ready on the GUI for immediate use. In other words, the system comprises instructions coded on a memory coupled to the processor, the instructions providing means for performing the method. The GUI is coupled with a memory and a processor. The memory is any hardware suitable for the storage of information. Such a system is a tool with which the design of at least some CAD modeled objects is easy. Such a system may thus be used by a wide array of users, including specialist designers. For example, the steps which involve the user are performed through the GUI (comprising a screen for user-interaction with it), while the fully computerized steps are performed by the processor accessing the memory, without involvement of the GUI.

The information stored in the memory (i.e. three-dimensional parametric shape(s)) may be stored in the form of a database. By "database", it is meant any collection of data (i.e. information) organized for search and retrieval. When stored on a memory, the database allows a rapid search and retrieval by a computer. Databases are indeed structured to facilitate storage, retrieval, modification, and deletion of data in conjunction with various data-processing operations. The database may consist of a file or set of files that can be broken down into records, each of which consists of one or more fields. Fields are the basic units of data storage. Users may retrieve data primarily through queries. Using keywords and sorting commands, users can rapidly search, rearrange, group, and select the field in many records to retrieve or create reports on particular aggregates of data according to the rules of the database management system being used.

The method and system generally manipulate modeled objects. A modeled object is any object defined by data stored in the memory. By extension, the expression "modeled object" designates the data itself. According to the type of the system, the modeled objects may be defined by different kinds of data. A CAD system is any system suitable at least for designing a modeled object on the basis of a graphical representation of the modeled object, such as CATIA. Thus, the data defining a CAD modeled object comprise data allowing the representation of the modeled object (e.g. geometric data, for example including relative positions in space). A CAD system may for example provide a representation of CAD modeled objects using edges or lines, in certain cases with faces or surfaces. Lines, edges, or surfaces may be represented in various manners, e.g. non-uniform rational B-splines (NURBS). Specifically, a CAD file may contain specifications, from which geometry may be generated, which in turn allows for a representation to be generated. Specifications of a modeled object may be stored in a single CAD file or multiple ones. The typical size of a file representing a modeled object in a CAD system is in the range of one Megabyte per part. And a modeled object may typically be an assembly of thousands of parts.

The system may also be a CAE and/or CAM system, and the CAD modeled object may also be a CAE modeled object and/or a CAM modeled object. Indeed, CAD, CAE and CAM systems are not exclusive one of the other, as a modeled object may be defined by data corresponding to any combination of these systems.

The CAD modeled object may typically be a 3D modeled object. By "3D modeled object", it is meant any CAD object which is modeled by data allowing its 3D representation. A 3D representation allows the viewing of the represented object from all angles. For example, a 3D modeled object, when 3D represented, may be handled and turned around any of its axes, or around any axis in the screen on which the representation is displayed. This notably excludes 2D icons, which are not 3D modeled. The display of a 3D representation facilitates design (i.e. increases the speed at which designers statistically accomplish their task). This speeds up the manufacturing process in the industry, as the design of the products is part of the manufacturing process.

The CAD system may be history-based. In this case, a CAD modeled object is further defined by data comprising a history of geometrical features (i.e. CAD operations, i.e. operations offered by CAD systems to design the object). A CAD modeled object may indeed be designed by a physical person (i.e. the designer/user) using standard modeling features (e.g. extrude, revolute, cut, and/or round etc.) and/or standard surfacing features (e.g. sweep, blend, loft, fill, deform, smoothing and/or etc.). This means that the creation history of design features is typically saved through an acyclic data flow linking the said geometrical features together through input and output links. In a history-based system, a CAD modeled object may be described by two persistent data representations: history and B-rep (i.e. boundary representation). The B-rep is the result of the computations defined in the history. The shape of the part displayed on the screen of the computer when the modeled object is represented is (a tessellation of) the B-rep. The history of the part is the design intent. Basically, the history gathers the information on the operations which the modeled object has undergone. The B-rep may be saved together with the history, to make it easier to display complex parts. The history may be saved together with the B-rep in order to allow design changes of the part according to the design intent.

Figure 2:
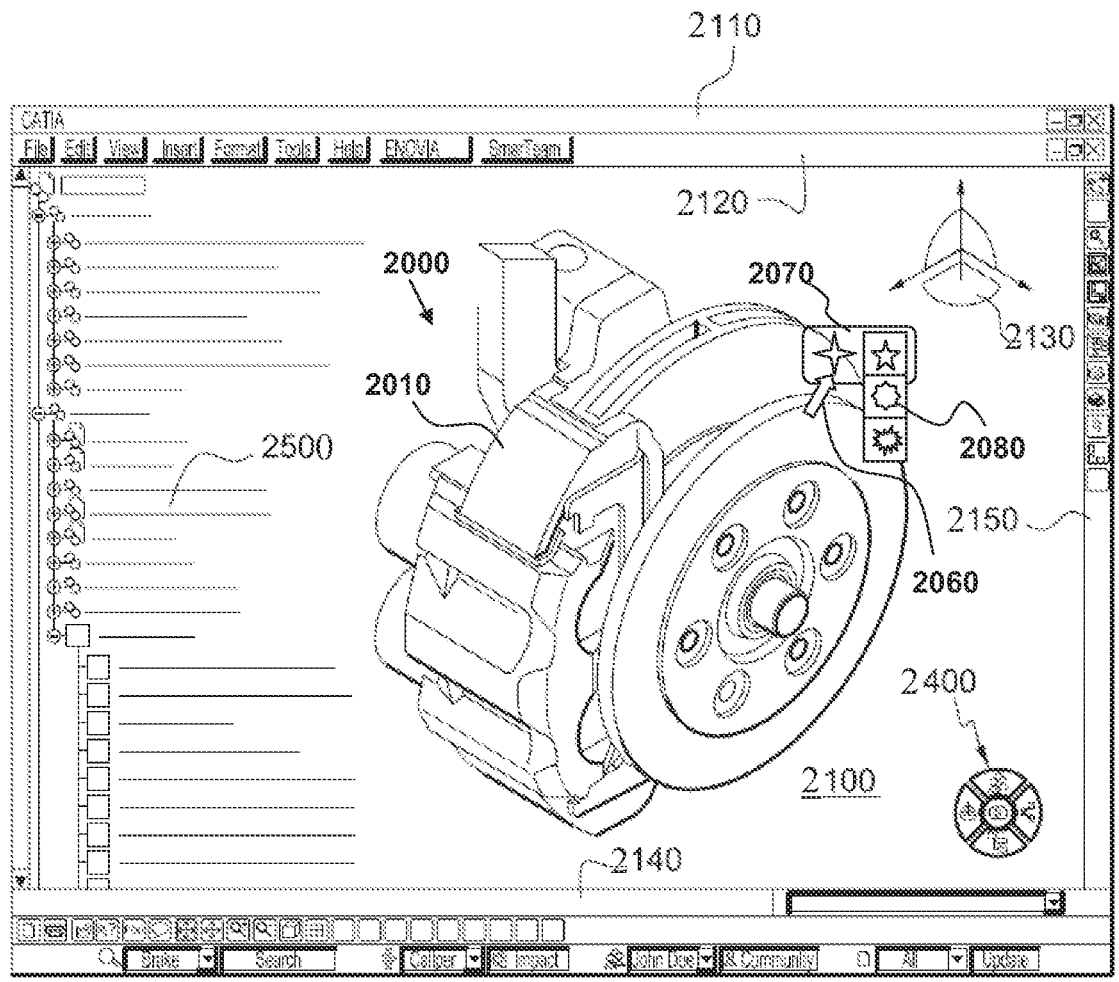
FIG. 2 shows an example of a graphical user interface.

FIG. 2 shows an example of the GUI of a typical CAD system.

The GUI 2100 may be a typical CAD-like interface, having standard menu bars 2110, 2120, as well as bottom and side toolbars 2140, 2150. Such menu—and toolbars contain a set of user-selectable icons, each icon being associated with one or more operations or functions, as known in the art. Some of these icons are associated with software tools, adapted for editing and/or working on the 3D modeled object 2000 displayed in the GUI 2100. The software tools may be grouped into workbenches. Each workbench comprises a subset of software tools. In particular, one of the workbenches is an edition workbench, suitable for editing geometrical features of the modeled product 2000. In operation, a designer may for example pre-select a part of the object 2000 and then initiate an operation (e.g. change the dimension, color, etc.) or edit geometrical constraints by selecting an appropriate icon. For example, typical CAD operations are the modeling of the punching or the folding of the 3D modeled object displayed on the screen.

The GUI may for example display data 2500 related to the displayed product 2000. In the example of FIG. 2, the data 2500, displayed as a "feature tree", and their 3D representation 2000 pertain to a brake assembly including brake caliper and disc 2010. The GUI may further show various types of graphic tools 2130, 2070, 2080, 2400 for example for facilitating 3D orientation of the object, for triggering a simulation of an operation of an edited product or render various attributes of the displayed product 2000. A cursor 2060 may be controlled by a haptic device to allow the user to interact with the graphic tools.

Figure 3:
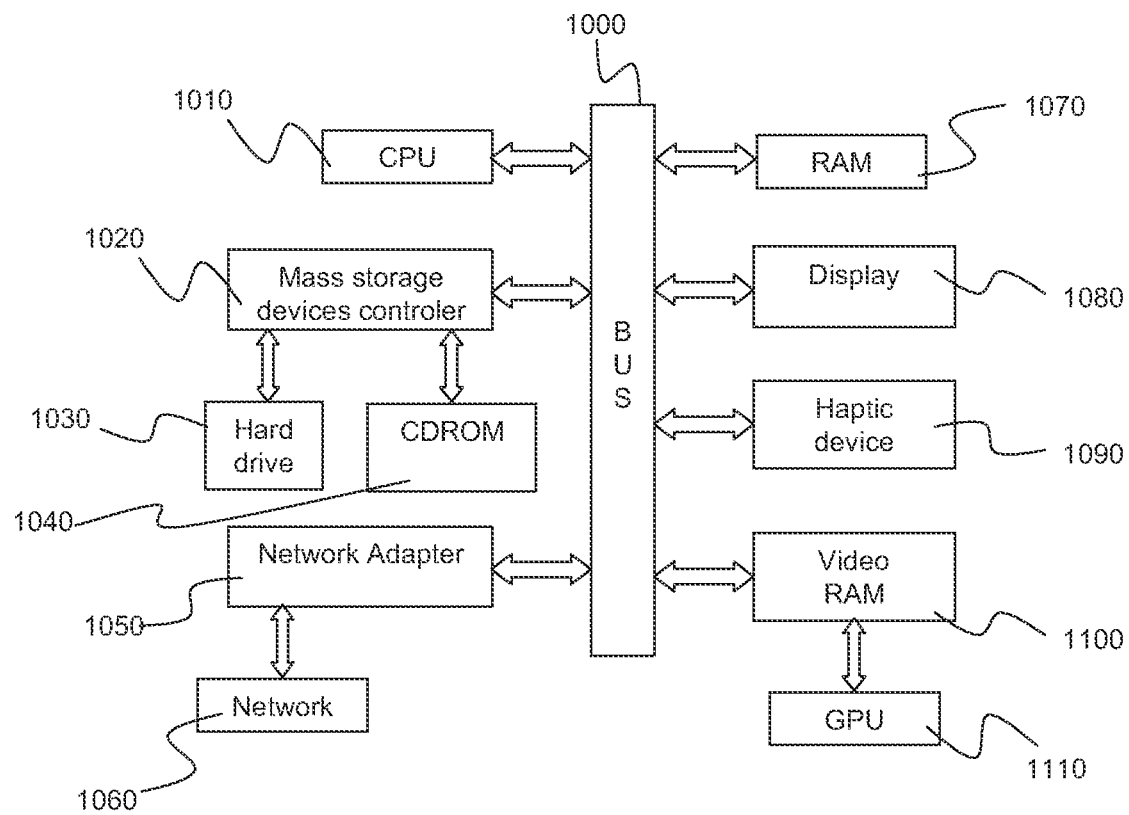
FIG. 3 shows an example of a client computer system.

FIG. 3 shows an example of the architecture of the system as a client computer system, e.g. a workstation of a user.

The client computer comprises a central processing unit (CPU) 1010 connected to an internal communication BUS 1000, a random access memory (RAM) 1070 also connected to the BUS. The client computer is further provided with a graphical processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on screen 1080, as mentioned with reference to FIG. 2. By screen, it is meant any support on which displaying may be performed, such as a computer monitor. In addition, the cursor control device allows the user to select various commands, and input control signals. The cursor control device includes a number of signal generation devices for input control signals to system. Typically, a cursor control device may be a mouse, the button of the mouse being used to generate the signals.

To cause the system to perform the method, it is provided a computer program comprising instructions for execution by a computer, the instructions comprising means for this purpose. The program may for example be implemented in digital electronic circuitry, or in computer hardware, firmware, software, or in combinations of them. Apparatus of the invention may be implemented in a computer program product tangibly embodied in a machine-readable storage device for execution by a programmable processor; and method steps of the invention may be performed by a programmable processor executing a program of instructions to perform functions of the invention by operating on input data and generating output. The instructions may advantageously be implemented in one or more computer programs that are executable on a programmable system including at least one programmable processor coupled to receive data and instructions from, and to transmit data and instructions to, a data storage system, at least one input device, and at least one output device. The application program may be implemented in a high-level procedural or object-oriented programming language, or in assembly or machine language if desired; and in any case, the language may be a compiled or interpreted language. The program may be a full installation program, or an update program. In the latter case, the program updates an existing CAD system to a state wherein the system is suitable for performing the method.

The steps (S1) to (S7) of the method are not necessarily consecutive. For example, the displaying (S1) may be performed continuously during the whole method (i.e. the shapes are continuously displayed). The evaluating (S6) may be performed after the selecting (S5) and the defining (S3). Independently, the user-interacting (S2) and the defining (S3) may be performed after the displaying (S1) and may be consecutive, and the selecting (S5) may be performed after the displaying (S1). However, as the user-interacting (S2) is continuous (i.e. has a duration in time) and is related to the defining (S3), the defining (S3) may be triggered by the user-interacting (S2) and thus start before the user-interacting has ended, in a dynamic way, so as to appear concomitant to the user (as the stroke may for example be displayed as well). As for the determining (S7), it may be performed after all steps (S1)-(S6), as the results of these previous steps are used.

Displaying (S1) the three-dimensional (3D) parametric shape(s) may be performed on the screen. The method helps the user design the CAD modeled object. The CAD modeled object evolves as the designer designs the object, for example through the user-interacting (S2) with the screen. The 3D parametric shape(s) is (are) at least part of the object. Thus, displaying (S1) the 3D parametric shape(s) helps the user decide how to perform design on the object. The displaying (S1) is in this sense closely linked to the user-interacting (S2). Indeed, the user-interacting (S2) typically acts on areas of the screen. This may be done directly, e.g. if the screen is sensitive (for example a single-touch or multi-touch screen) and the user applies pressure on the screen, or indirectly, e.g. by using a haptic device such as a mouse, or a touchpad on which a user can apply a touch-pen. This could also be done by pointing a laser on the screen or any other way of interacting with the screen, depending on the type of the screen. A user-interacting (S2) through a touchpad or a sensitive screen makes the user-interacting (S2) more life-like (i.e. more similar to the traditional ideation phase where a specialist designer designs the object on paper). A life-like method for designing CAD modeled object is helpful as it helps specialist designers to use the CAD system. The design is thus easier.

At least one 3D parametric shape is displayed. The shapes are geometric forms for which there is a representation. The shapes may for example be curves, surfaces, points, and/or volumes. When the shapes are curves, the method is more life-like since a specialist designer often works on curves.

The shapes are 3D and parametric. This ensures that the CAD modeled object is ready for use as an input in a wide array of CAD operations. A 3D shape is modeled by data (i.e. such data is stored in the memory of the system) that allow the 3D representation of the shape. As discussed above, this excludes icons or 2D drawings. A parametric shape is modeled by at least one function of at least one parameter (i.e. such function is stored in the memory of the system). The function may provide the position of points of the shape. For example, a 3D parametric curve may be modeled by a function $C(u)=(x(u), y(u), z(u))$, e.g. a NURBS. In the field of CAD, modeling elements of the CAD modeled object such as the shapes with parametric functions allows for performing CAD operations on the shapes. Indeed, the CAD operations of most CAD systems are not performable on a simple pixel map which is a representation of an object. In other words, most CAD operations of CAD systems need the parametric function as an input to be executed. Thus, more elaborate operations may be performed on parametric shapes.

The method comprises defining (S3) on a support at least one stroke corresponding to the user-interacting (S2). For example in the case of a computer monitor, by user-interacting (S2) with the screen, the user activates some pixels of the screen. These pixels may be translated in at least one stroke (several strokes in case of a discontinuous user-interacting (S2) or in case of a multi-touch screen), as known in the art. For example, if the user-interacting (S2) is performed through a pointing device or through a touch pen, the pixels activated correspond to the locations of the pointing device or the touch pen. These activated pixels may be dynamically displayed on the screen. The activated pixels may be translated in a stroke on the support. The support may be a geometrical entity (visible or invisible) adapted for receiving a stroke. The support may act as a socle for the stroke. The support may for example be any kind of surface. Such surface may be a plane, for example the screen plane, or any other drawing surface. Indeed, a drawing surface different from the screen plane may be embedded in the (design area of the) screen. Defining (S3) a stroke generally means locating positions on the support which visually form a continuous line. These positions may indeed be displayed. This may be done for example by keeping track of the position of at least some of the pixels activated on the screen, and for example by projecting them on the support (when the support is different from the screen plane). Thus, the stroke corresponds to the user-interacting (S2) in the sense that it is derived from what is sketched by the user through the user-interacting. Thus, in a sense, the stroke is sketched by the user through the user-interacting (S2). As a result, the definition of the stroke is entirely life-like, the support virtually corresponding here to the drawing paper (the paper being virtually orthogonally faced by the designer when the support is the screen plane).

The method comprises the selection (S5) of a number of the 3D parametric shapes which are displayed. (The term "number" used alone designates the number of selected shapes, unless mentioned otherwise.) This number may be equal or higher to 1 (it may notably be 1 in case only one shape is displayed). The selected shapes are inputs to the geometrical CAD operation to be determined at (S7). Indeed, the method further comprises, after the selection (S5), determining (S7) a geometrical CAD operation foreseen to be performed on the selected shape(s), and possibly further performing the operation. The determining (S7) is performed among several possible operations. In other words, the determining (S7) could possibly result in different operations. Using the system in different situations would probably lead to different operations being determined. The operation processes data modeling the modeled object. In the case of the method, the geometrical CAD operation takes as inputs 3D parametric shapes. The method provides for a way of performing such geometrical CAD operation faster and in an easier way for the user, as the determination (S7) is faster and easier, as explained hereunder.

A geometrical CAD operation is any operation provided by a CAD system that modifies the geometry of the modeled object (e.g. statistically). The data modeling the CAD object indeed include geometry specifications. For example, these specifications include positions and/or forms of the 3D shapes. To modify the geometry of the modeled object means to modify at least one of such geometry specifications. These geometry specifications are notably gathered by the parametric functions modeling the shapes. A geometrical CAD operation may thus use as an input the parametric functions. A geometrical CAD operation may be an operation which creates a new 3D parametric shape, which deletes an existing 3D parametric shape, which modifies a 3D parametric shape, which creates/deletes links between the existing parametric shapes.

Examples of classical geometrical CAD operations are now discussed. The CAD system may provide any or a combination of the examples. The determining (S7) may comprise searching for an intended operation among these examples. A "stretch" is a geometrical CAD operation. A stretch of a shape comprises increasing one dimension (e.g. the length or the width) of a shape, e.g. without modifying substantially the other dimensions of the shape. A "scale" is another geometrical CAD operation, which comprises increasing all dimensions of a shape proportionally. "Blend", "match" and "concaten" are other geometrical CAD operations which reunite two shapes. The blend creates an intermediate shape reuniting the two initial shapes. The result thus has three shapes. The match modifies one or both of the initial shapes to reunite them. The result thus has two shapes. The concaten creates a new shape to replace the two initial shapes, e.g. by interpolating them. The result thus has one shape. Other geometrical CAD operation comprise "move" operations, such as the "rotate" or the "translate" operations, which act on the position of input shapes. The "cut" operation divides a shape into two shapes. The "erase" operation erases a length of the shape. The "extrapol" operation applies a prediction scheme and increases a shape in a dimension following the prediction. The "corner" operation, or "fillet", rounds an angle of a shape or between two shapes. The "chamfer" operation cuts in a straight-line an angle of a shape or between two shapes. The "edit" operation modifies at least a part of a shape.

In the prior art, a geometrical CAD operation is determined by manual and difficult means. Indeed, in the prior art, the geometrical CAD operation is determined by clicking on a dedicated icon of the GUI, or by accessing a dedicated menu.

In the case of the method, the method comprises evaluating (S6) a relative position of the stroke with the selected shape(s). The method may then comprise determining (S7) a geometrical CAD operation based on the number and the relative position. This method makes the application of a geometrical CAD operation easier by diminishing the interventions of the user, as the evaluating (S6) is performed automatically. In other words, the determining (S7) is not performed by a user accessing an icon or a dedicated menu for selecting an operation that he/she wishes to perform.

The relative position of the stroke with one selected shape designates any information on how the stroke and the selected shape are positioned with respect to one another. The number of inputs of the operation together with the relative position is information that distinguishes correctly between different user intended operations. For example, the selected shape may divide the space of the support (e.g. the screen plane) in different areas. If the shape is a curve, there may be an area above the curve, and below the curve. The relative position of the stroke with the selected shape may thus be the information "above", or "below" the selected shape. The relative position of the stroke with a shape may thus be evaluated (S6) in many different ways. For example, the evaluating (S6) may comprise projecting the shapes on the support (e.g. the screen plane), the relative position being a relative position on the support. This simplifies the evaluating (S6).

In an example, it is evaluated (S6) if the stroke is proximate to an extremity of the shape. For example, if the shape is a curve, it is evaluated (S6) if the stroke approaches the end of the curve. This may performed by determining the end of the curve (by any means, e.g. as an ending point of the curve), determining the distance between the stroke and the end, and comparing the distance to a threshold (the threshold may be proportional to the total length of the curve). Additionally or alternatively, it may be evaluated (S6) if the stroke and the shape have a same direction and/or a same sense. For example, a tangent vector of the stroke is compared to a tangent vector of the selected shape. In case the shape is a curve, it may thereby be evaluated (S6) if the shape and the stroke have a similar direction and/or a similar sense (for the sense, this is possible as the shape and the stroke may be ordered). The terms "direction" and "sense" have their common meaning in geometry, referring to the direction Vs the sense of a vector. The direction is a line and the sense is an order/way on the line (e.g. a vector indicating which way is the positive way). The term "similar" means "same within a range". The rules for determining similitude (i.e. the rules determining the range) depend on the implementation.

The number of selected shapes may determine among which geometrical CAD operations provided by the system the determining (S7) occurs. For example, the geometrical CAD operations potentially to be determined at (S7) are restricted to the geometrical CAD operations having a number of inputs equal to the number of selected shapes. The relative position then determines (S7) the correct geometrical CAD operation (i.e. the one intended by the user), e.g. by following a pre-determined decision tree. With such a method, the stroke allows for determining (S7) fast the geometrical CAD operation intended by the user. The method thus allows for a fast performing of the operation should it be the case, as very few user interventions are required to determine (S7) the operation. The system analyses the stroke and may automatically perform the operation corresponding to the user-intent.

Evaluating (S6) a relative position may comprise determining an intersection between the stroke and the selected shape(s). The intersection may be an intersection between the stroke and the projection of the selected shape(s) on the support (e.g. the screen plane). This may be performed simply by discretizing the stroke into stroke points, and determining shape points by discretizing the shape and then projecting the discretized shape on the support, "shape points" being thereby obtained. Discretizing the stroke means sampling the stroke, for example by reducing the stroke to a number of points which are called the "stroke points". As the stroke is a set of positions on the support, discretizing the stroke thus means reducing (i.e. decreasing the number of) the set of positions to the sole stroke points. Similarly, the projection of a shape may comprise shape points. For example, the shape points are determined by discretizing the shape and then projecting the discretized shape on the support. As the shapes are parametric, discretizing a shape means sampling it in sampled points, e.g. by deriving points out of the parametric function(s). Projecting a shape may then consist in projecting the sampled points. The projections of the sampled points are called "shape points" and may thereby form the projection of the shape (thus, the projection of the shape is not necessarily the whole projection of the whole shape). This increases CPU efficiency as projecting points is less costly.

This increases speed efficiency of the evaluation (S6). Indeed, the positions of the stroke points and the shapes points may then be compared by any kind of implementation. For example, the method may comprise determining for which couple of stroke points St(i) and St(i+1) of the stroke and which couple of shape points Sh(j) and Sh(j+1) the lines [St(i), St(i+1)] and [Sh(j), Sh(j+1)] cross each other, and then evaluating the intersection by further iterative dichotomization, e.g. until a minimum length for [St(i), St(i+1)] is reached. Alternatively, the intersection lay be computed by determining a parametric function representing the stroke, and solving a system involving the parametric functions of the shape and of the stroke. In addition (e.g. if no "true" intersection is found) or solely (in all cases), the selected shapes may be extrapolated, with techniques known per se. For example, if the shapes are curves, base curves may be determined (the selected curve being a portion of the base curve). Here, an intersection between the stroke and a shape designates the intersection between a base of the stroke and a base of the projection of the shape on the support (e.g. the screen plane).

In case such intersection(s) is (are) determined, evaluating a relative position may further comprise determining if the intersection is in an extremity portion of the selected shape, determining if the intersection is in an extremity portion of the stroke, determining if a tangent vector of the stroke and a tangent vector of the selected shape at the intersection are collinear, and/or determining if a tangent vector of the stroke and a tangent vector of the selected shape at the intersection have a same sense. The extremity portion of the selected shape (and/or the stroke) may be defined as a neighbourhood around an end point of the selected shape (and/or the stroke). The size of the extremity portion may depend, e.g. increasingly, on a dimension of the selected shape (and/or the stroke). The tangent vectors are evaluated at the intersections. In the method, the tangent vectors may be considered collinear if their normalized cross product (which may thus be computed in the method) is below a certain threshold (for example 0.1 or even 0.01), following a test performed in effect. In the method, the tangent vectors may be considered having a same sense e.g. if their scalar product (which may thus be computed) is positive, following a test performed in effect. Such criteria have been tested, and they correctly distinguish different user-intents (i.e. the intended operations are correctly differentiated by these criteria).

For example, determining if the intersection is in an extremity portion of the selected shape may be followed by determining if the intersection is in an extremity portion of the stroke when the number is 1 and the intersection is not in an extremity portion of the selected shape. However, when the number is 1 and the intersection is in an extremity portion of the selected shape, determining if the intersection is in an extremity portion of the selected shape may be followed by determining if a tangent vector of the stroke and a tangent vector of the selected shape at the intersection have a same sense. When the number is 2 and the intersection is not in an extremity portion of the selected shape, determining if the intersection is in an extremity portion of the selected shape may be followed by determining if a tangent vector of the stroke and a tangent vector of the selected shape at the intersection are collinear.

The operation may be determined to be: the cut operation when the number is 1, the intersection is not in an extremity portion of the selected shape, and the intersection is not in an extremity portion of the stroke; one of several operations suggested, wherein the several suggested operations are the translate and the rotate operation, when the number is 1, the intersection is not in an extremity portion of the selected shape, and the intersection is in an extremity portion of the stroke; the erase operation when the number is 1, the intersection is in an extremity portion of the selected shape, and the tangent vector of the stroke and the tangent vector of the selected shape at the intersection have a different sense; the extrapol operation when the number is 1, the intersection is in an extremity portion of the selected shape, and the tangent vector of the stroke and the tangent vector of the selected shape at the intersection have a same sense; the chamfer operation when the number is 2, the intersection is not in an extremity portion of the selected shape, and the tangent vector of the stroke and the tangent vector of the selected shape at the intersection are not collinear; the corner operation when the number is 2, the intersection is not in an extremity portion of the selected shape, and the tangent vector of the stroke and the tangent vector of the selected shape at the intersection are collinear; or one of several operations suggested, wherein the several suggested operations are the blend, the match and the concaten operation, when the number is 2 and the intersection is in an extremity portion of the selected shape. All the operations mentioned are thus provided by the CAD system. This method allows a fast determination (S7) of the operation with a good correspondence to the user-intent.

Determining (S7) an operation may comprise user-selecting one of several operations suggested based on the number and the relative position. First, the different tests mentioned above may be refined and a response to a test may be not binary. This might lead to the system determining (S7) different potential solutions. Also, the tests may refine the scope of search, but not necessarily lead to a unique solution. In such cases, the method may offer to the user to manually select among several possibly intended operations. This method is a refinement compared to the case where the determining (S7) is fully automatic, but it still makes the method easier (compared to prior art) as the user-selecting may be performed through a limited number of operations provided explicitly to the user (i.e. without the user having to master the system in order to search for these operations). The results may be proposed for user-selection in a user-friendly way, for example through a dialog box with buttons, wherein clicking on a button finishes the determining (S7) of an operation.

As a whole, the method allows for a fast determination (S7) which respects the user intent in the context of 3D parametric CAD. Sketching a stroke, in a continuous manner, is a lot easier than searching and clicking on a dedicated icon or menu. It is all the easier since most steps of the method may be performed automatically, solely by the computer. Projecting the shapes (if it is the case) before determining a geometrical CAD operation ensures that user-intent is respected, in a specific context of CAD which allows for refined ulterior design (as the object is modeled by the shapes which are 3D and parametric).

The fact that the determining (S7) is based on the user-interacting (S2) means that several operations are potentially determinable. In other words, several operations may be available for determination with the same level of difficulty in the user-interacting (S2) (i.e. the same type of user-interacting). Thus, iterating the method with a different user-interacting (S2) at each iteration would normally lead to a different operation to be performed. Thus, the method may be iterated with a different geometrical CAD operation being determined (S7) at different iterations.

The method thus allows for an easy and fast determination (S7) of a user-intended geometrical CAD operation, with minimized interventions by the user. In the case of the method, the selection (S5) of the number of shapes (on which the operation acts) may be performed by any means. For example, this selection may be manual, e.g. through clicking on shapes. The selection may also be performed when intersections between the stroke and the shapes are evaluated, only the shapes having a projection with a true intersection with the stroke being selected.

Figure 4:
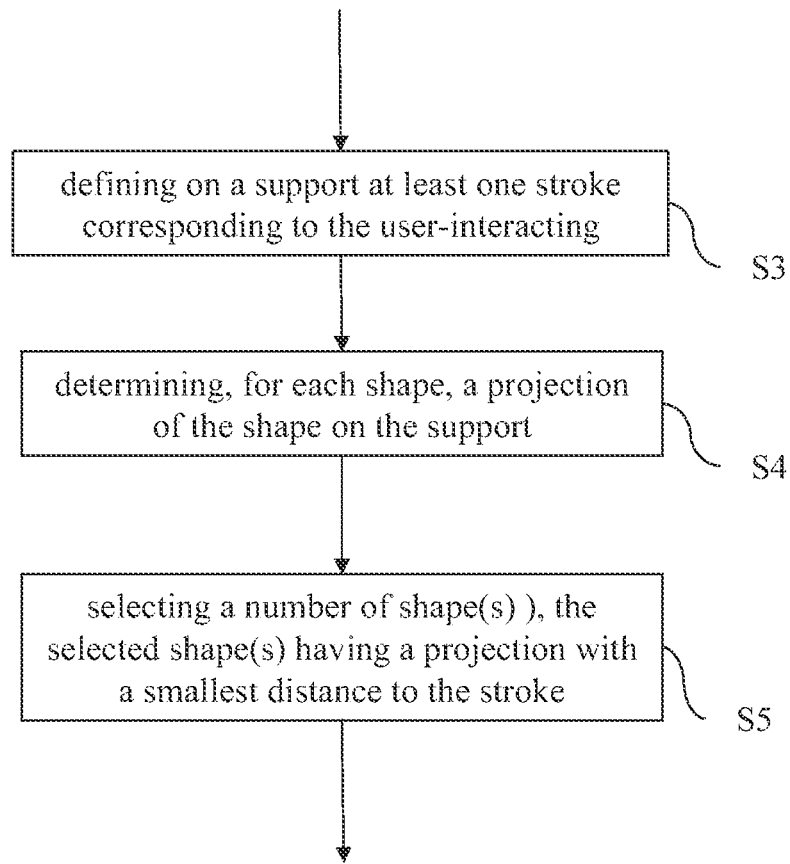
FIGS. 4-8 show flowcharts representing examples of the method.

Alternatively, and referring to FIG. 4, the method may comprise, prior to the selection (S5), determining (S4), for each shape, a projection of the shape on the support. The selected shape(s) may then be the shape(s) having a projection with a smallest distance to the stroke. Such selection is fast and easy.

For each shape, determining (S4) a projection of the shape on the support is performed easily because the shapes are parametric. The parameterization of the shape allows for simple projection on any support. The projection may be any projection, e.g. perspective, isometric, or oblique.

The projection of the shape may then be used for selecting (S5) at least one shape. This allows for a fast execution of the selection (S5). Indeed, when designing the CAD modeled object, the designer often needs to select at least one shape, e.g. in order to perform a geometrical CAD operation on the selected shape(s). In the prior art, this selection is done manually, for example by clicking on the shape(s) to be selected with a mouse pointer. In the prior art, if the click is not performed exactly on the shape, the shape is not selected. Furthermore, in the prior art, each shape must be selected individually. On the contrary, with the method, be it for selecting one shape or at least two shapes, a simple stroke is sufficient. Thus, in this example, the selection (S5) is not a click on the shape. Indeed, the stroke may be not fully on a shape but only pass near the shape. This makes the selection (S5) very quick and thus the method easier. Specifically, a distance between the stroke(s) and the projected shapes is contemplated. The selected shape is the shape which has the projection with the smallest distance to the stroke. This ensures that user intent is respected. Determining (S4) a projection of the shape on the support before the selection (S5) indeed ensures that the shape closest to the stroke visually relative to the support, thus the shape which is intended to be selected, is indeed selected. This all the more the case when the support is the screen plane. Without a projection, this would not necessarily be the case as the shapes are initially 3D. Furthermore, the method is very efficient as, with a diminished number of user interventions (i.e. sketching the stroke), the method may both select the inputs and determine the geometrical CAD operation to be performed automatically.

The method may further comprise, for each shape, computing (S45) a distance between the stroke and the projection of the shape. The computed distance is thus a distance on the support (i.e. a distance between A and B on the support being the length of the smallest path on the support between a point of A and a point of B). This computation (S45) is performed automatically, by the computer, e.g. using a pre-defined distance computation scheme. The computation (S45) is performed before the selection (S5). The computation (S45) thus allows the selection (S5) of the shape having the smallest distance to the stroke. If at least two shapes are determined as having the same distance to the stroke, two or one of the shapes may be selected arbitrarily (for example, the first one for which the distance has been computed, or, the largest one). Alternatively, these shapes may be suggested to the user who can select one manually, e.g. by clicking on a respective button. However, this situation is not frequent since the user naturally sketches the stroke near the shape to be selected (according to the distance).

The distance may be any type of distance, for example Euclidian in case the support is a plane such as the screen plane, or geodesic if the support is a sphere. In order to increase efficiency, the stroke may be discretized into stroke points (this discretization may be common to a discretization in an example of the evaluating (S6)). Discretizing the stroke means sampling the stroke, for example by reducing the stroke to a number of points which are called the "stroke points". As the stroke is a set of positions on the support, discretizing the stroke thus means reducing (i.e. decreasing the number of) the set of positions to the sole stroke points. The computed distance between the stroke and the projection may then be a minimum of distances between at least part of the stroke points and the projection. In other words, a subset, or, the whole set of stroke points are compared as to their distance to the projection, the point with the smallest distance being selected in (S5). This increases speed efficiency of the selection (S5).

Similarly, the projection of a shape may comprise shape points. For example, the shape points are determined by discretizing the shape and then projecting the discretized shape on the plane (this may have been done previously). As the shapes are parametric, discretizing a shape means sampling it in sampled points, e.g. by deriving points out of the parametric function(s). Projecting a shape may then consist in projecting the sampled points. The projections of the sampled points are called "shape points" and may thereby form the projection of the shape (thus, the projection of the shape is not necessarily the whole projection of the whole shape). This increases CPU efficiency as projecting points is less costly. The distance between a stroke point and the projection may be the minimum of distances between the stroke point and the shape points. Such minimum may be computed. At this stage, the selection (S5) may thus consist in solving the following optimization program: min distance(stroke point, shape point), the min being evaluated over at least part of all the stroke points and over all the shapes (or part of the shapes).

Prior to the computing (S45), the method may comprise evaluating (S43, S44) intersections between the stroke and the shapes. A shape having a projection intersecting the stroke is selected at (S5). If the stroke intersects more than a shape, then all shapes or a part of those shapes may be selected. These shapes intersecting the stroke have a distance on the support to the stroke which is equal to zero. Thus, these shapes have a distance to the stroke which is the smallest. The computing (S45) may thus be subject to the result of the evaluating (S43, S44) (i.e. if no intersecting shape is found, then the computing is performed, else the computing is not performed). Alternatively, the computing (S45) may be performed in all cases, more than a shape being thereby potentially selected at (S5) (for example, one or more intersecting shapes and one or more shapes being found to have a smallest distance with the computing (S45)).

Figure 5:
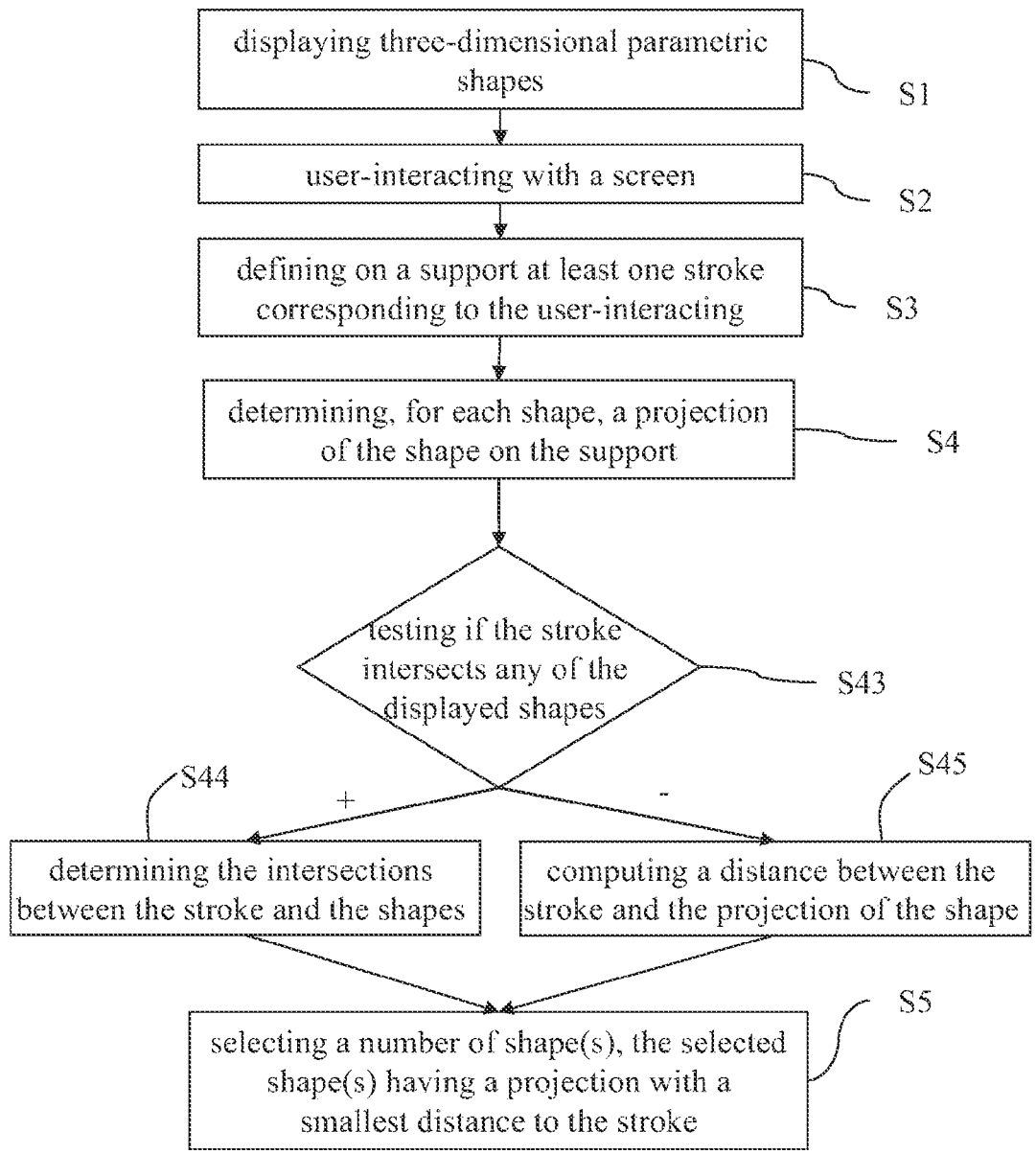
Figure 6:
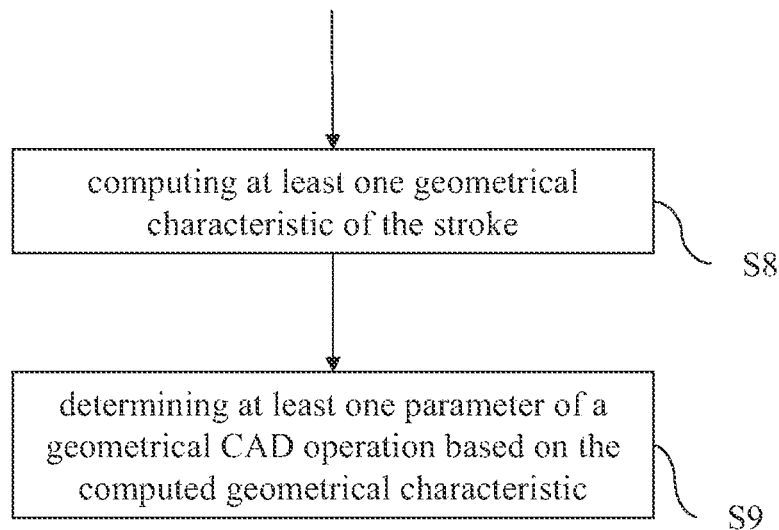

The evaluating (S43, S44) may comprise testing (S43) if the stroke intersects any of the displayed shapes and determining (S44) such intersections should it be the case. The determining (S44) may be performed with the projection of the shapes. In other words, the determining (S44) determines intersections between the stroke and the projection of the shapes. This may be based on the discretization of the stroke and/or the discretization of the shape, using any means for computing intersections common to the one skilled in the art. An example of the method comprising both the evaluating (S43, S44) and computing (S45) is illustrated on the flowchart of FIG. 5.

The computing (S45) and the selecting (S5) may be iterated. At each iteration, the selected shape is selected within the shapes not selected in a previous iteration. In this case, the stroke is also discretized into stroke points, and the computed distance between the stroke and the projection is a minimum of distances between only a part of the stroke points and the projection. At each iteration, the part of the stroke points may be a different part. Thus the same stroke conveys different information, according to the respective parts of the stroke. These different information are used to select different shapes at iterations of (S5). This refines the selection (S5).

For example, at a first iteration, the computed distance between the stroke and the projection is a distance between a beginning of the stroke and the projection. Then, at a second iteration, the computed distance between the stroke and the projection may be a distance between an end of the stroke and the projection. When the stroke is discretized, the stroke points may be gathered within different parts (beginning and end, possibly also intermediate, etc). For example the beginning comprises the five first stroke points while the end comprises the five last stroke points. Those parts of the stroke may imply the selection (S5) of a different shape. This is particularly useful in the case of design operations which require at least two input shapes. In the case of the prior art, the input shapes must be selected one by one by clicking on them. Here, the method allows for selection of several shapes through only one stroke.

Alternatively, only the computing (S45) may be iterated. The selecting (S5) may then be iterated only if the computing provides a smallest distance inferior to a predetermined threshold. This allows deducing fully automatically from the stroke if the user wants to select one shape or more than one shape.

In case the user-interacting is a multi-touch interacting, several strokes may be defined simultaneously as explained above. In this case, several shapes may correspondingly be selected, each of the selected shape being at a smallest distance from a respective stroke when projected. In a reduced intervention (the multi-touch interacting), the user is thus able to select more than a shape, which makes the method very efficient.

However selecting (S5) the inputs of the geometrical CAD operation foreseen is performed, the method may further comprise determining at least one parameter of the geometrical CAD operation.

A parameter of a geometrical CAD operation is a quantity (with one or more dimensions) upon which the CAD operation is executed. As explained earlier, a geometrical CAD operation has inputs comprising one or more of the 3D shapes. Further to these inputs, a geometrical CAD operation may use geometrical information, designated herein by "parameter", that tell how the geometrical CAD operation is to be performed. The parameter may depend on the geometrical CAD operation.

Determining at least one parameter of the geometrical CAD operation means determining the value to be used, for the parameter, for performing the operation. Determining at least one parameter of the geometrical CAD operation may be performed by any means. For example, a dialog box may be presented to the user, who may enter the value of the parameter.

Alternatively, the method may comprise computing (S8) at least one geometrical characteristic of the stroke. A geometrical characteristic of the stroke is any geometric information (or specifications) determined from the data defining the stroke. A geometrical characteristic of the stroke allows determining the parameter. Indeed, the method may then comprise determining (S9) the parameter based on the computed geometrical characteristic. This means that the parameter is determined as a function of the geometrical characteristic. The program may store such a function and evaluate it with an input which is the geometrical characteristic of the stroke (more exactly, the value taken by the geometrical characteristic of the stroke). The geometrical CAD operation of (S9) is the operation foreseen to be performed. The method improves the design of the CAD modeled object by making such design even easier.

Indeed, only by user-interacting (S2) in a minimized number of interventions with the screen, the user may not only determine (S7) the operation foreseen, but also select shapes on which the operation is foreseen to be performed, and/or determine (S9) the parameter(s) of the operation. The stroke defined (S3) indeed allows for automatic computing (S8) of a geometrical characteristic from which a parameter may automatically be determined (S9). Thus, sketching a stroke by the user here serves a double (possibly a triple) purpose.

The determining (S9) (or the computing (S8)) may be subject to the prior determination of the CAD operation (for example by (S7)). In such a case, only the parameter(s) of interest may be determined at (S9). In such a case, only the geometric characteristic of interest may be computed at (S8). This optimizes the method. Alternatively, all geometrical characteristics may be computed and possibly all parameters may be determined, the correct parameter(s) being selected at the time the operation is to be performed.

The geometrical characteristic of the stroke may include one or more of a tangent vector of the stroke, a normal vector of the stroke, a first point of the stroke, a last point of the stroke, a center of a bounding box of the stroke (i.e. a rectangle containing the stroke), and a position of the stroke. Thus, the method may include evaluating any or a combination of such possible geometrical characteristics. This may comprise discretizing the stroke (which may have already been done as explained earlier).

The method may further comprise determining at least one geometrical characteristic of the shape, the shape being an input of the operation. Determining (S9) at least one parameter of a geometrical CAD operation is then further based on the geometrical characteristic of the shape. This refines the determination (S9) of the parameter(s). Indeed, the geometrical characteristic of the shape is in this case a further input for the determination (S9).

The geometrical characteristic of the shape may be determined after projecting the shape on the support. This makes the method more life-like, notably if the support is the screen plane.

Examples of the method depending on the operation are now discussed. The method may implement the following actions in case the operation is any of the following operations. These examples allow an adaptation of the method to the usual CAD operations, as their usual parameters are detailed below.

When the operation is a blend, a match or an extrapol operation, the parameter may include the continuity level. The continuity level is the level of continuity (Ci or Gi) of the shapes resulting from the operation, e.g. at zones of the shapes modified by the operation. The continuity level may be determined as: G2 if the tangent vector of the stroke and the tangent vector of the shape are evaluated to be collinear and the normal vector of the stroke and the normal vector of the shape are evaluated to be collinear, G1 if the tangent vector of the stroke and the tangent vector of the shape are evaluated to be collinear and the normal vector of the stroke and the normal vector of the shape are evaluated to be not collinear, or G0 otherwise.

For example, the stroke may be discretized. Then, the tangent and normal vectors of the input shape at a zone of the shape at an intersection between the stroke and the shape may be computed. Then, the method may comprise computing tangent and normal vectors of the stroke at the same intersection. For instance, the tangent vector is the difference between the intersection point and the previous point in the ordered discretization of the stroke, and the normal vector is the cross-product between the tangent vector and a unitary vector normal to the support, e.g. the drawing plane. The operation may then be performed in a way that such continuity is reached, as know in the art.

When the operation is a blend or a match operation, the parameter may further include the tension. The tension designates a level of detail at an extremity of the reunion of the two inputs of the operation. Here, the reunion designates the created intermediate shape (in case of a blend) or the modified input shapes (in case of a match). An extremity of the reunion is thus an extremity of the intermediate shape (in case of a blend) or a modified extremity of the input shapes (in case of a match). The level of details designates how much information is present regarding such extremities. In case the shapes are defined by control points (such as shapes which are NURBS curves), the tension may designate a distance between at least one couple of the control points at the extremities. For example, the tension may be a tangency tension or a curvature tension (or both). A tangency tension designates the distance between the first and second control points. A curvature tension designates the distance between the second and third control points. The tension may be determined as a norm of a tangent vector of the stroke divided by a norm of a tangent vector of the shape. The tangent vectors may be computed as in the example above.

When the operation is an extrapol operation, the parameter may further include the length. The length represents the limit(s) of the extrapol. The length may be determined as a norm between the first point and the last point of the stroke. The length may also be a parameter for the erase or the translate operations.

When the operation is a corner or a chamfer operation, the parameter may include the quadrant. The quadrant designates the couple of parts of shapes between which the operation is executed. For example, if the inputs of the operation are two curves crossing each other at least when projected, four different corners (or chamfers) may be performed between couple of halves of the curves. The quadrant designates between which couple the corner (or chamfer) must be performed. The quadrant may be determined as a couple of shape parts comprising the position of the stroke. The position of the stroke may be compared to positions of the shapes.

When the operation is a corner operation, the parameter may further include the radius. The radius of a corner (i.e. a fillet) is a parameter widely known in the art. The radius designates the measure of how round the corner is. The radius may be determined as a distance between the center of the bounding box and the first point of the stroke.

When the operation is the blend, match, corner or chamfer, the parameter may further include contact points. The contact points determine where on the input shapes, the operation is to be applied. The contact points may be determined based on the position of the stroke, as the intersections between the stroke and the shapes. When the operation is the translate operation, the parameter may further include the direction. When the operation is the rotate operation, the parameter may include the axis and the angle.

In general, two vectors may be evaluated to be collinear if their cross-product is inferior to a threshold, for example if their normalized cross-product is inferior to 0.1 or 0.01.

Figure 7:
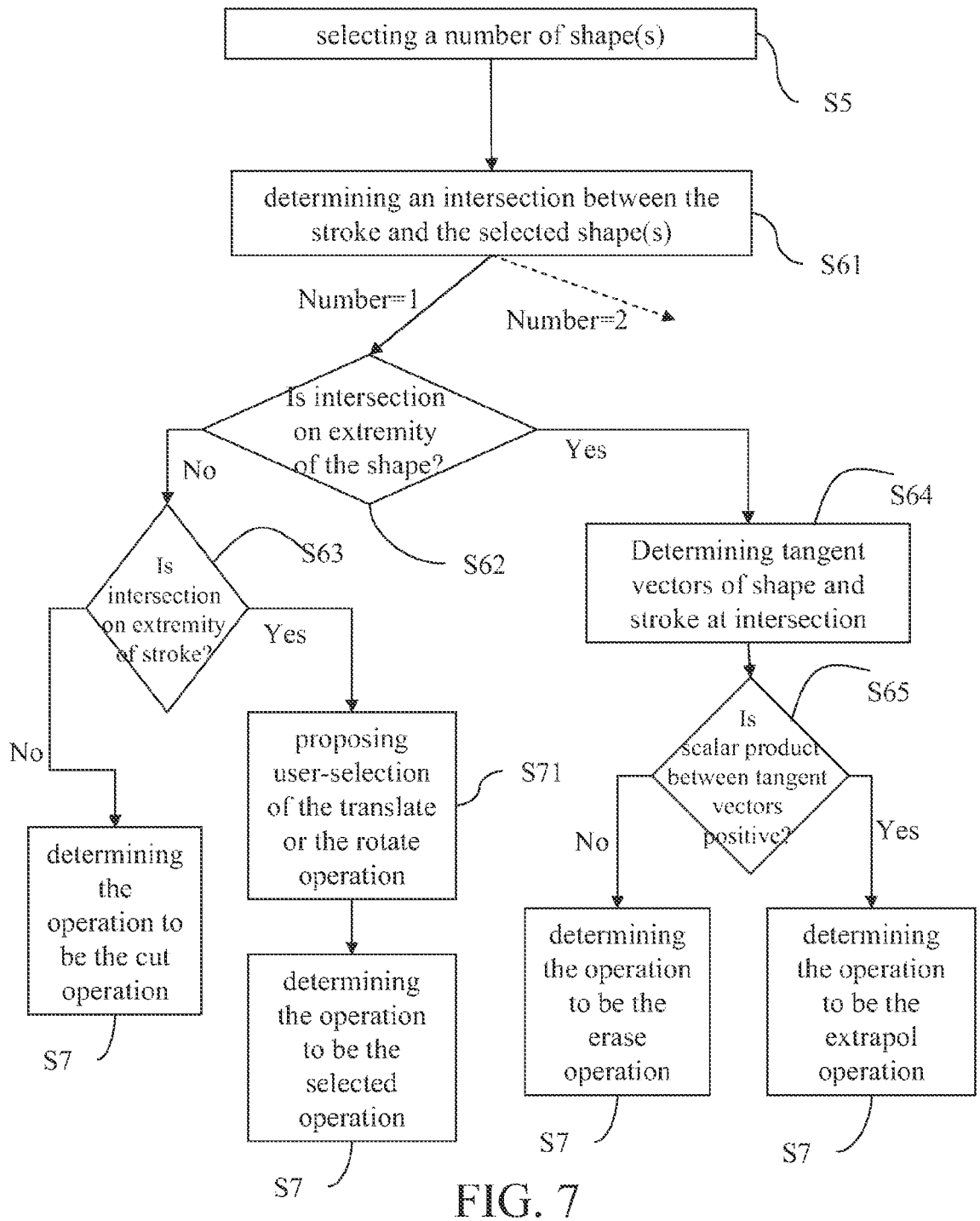
Figure 8:
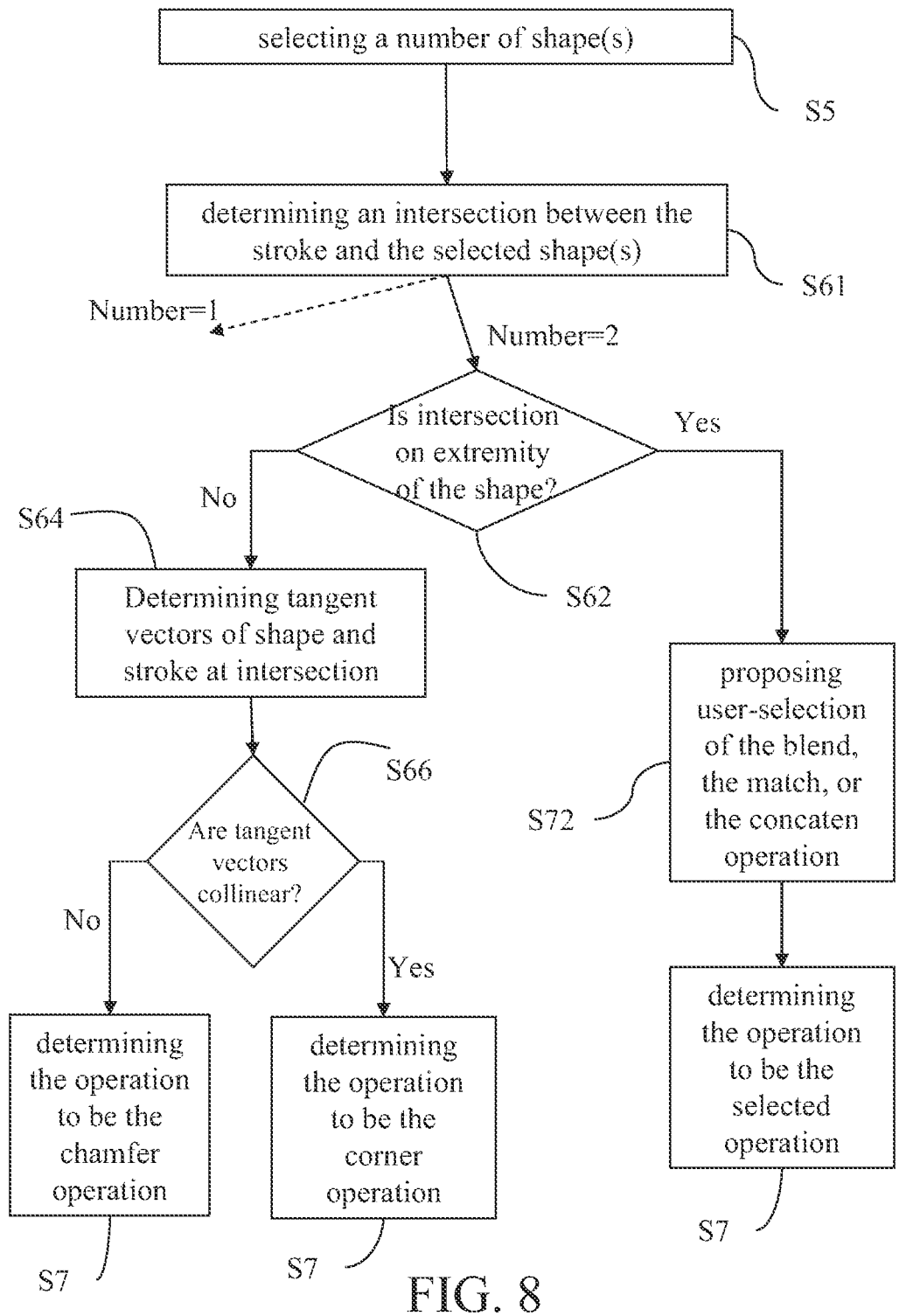

FIGS. 7-8 represent a decision tree (cut in two halves represented respectively in FIG. 7 and FIG. 8 for convenience), which leads to performing an example of the method. The example is focused on steps S6 to S7 (i.e. the determining of the operation). Prior to that, the number of shapes may be selected in any possible way (notably the ones discussed above). After that, the parameters of the operation, if any, may be determined in any possible way (notably the ones discussed above). In the example, the evaluating (S6) of a relative position of the stroke with the selected shape(s) comprises a combination of (S61 to S66), according to the result of the different tests (S62, S63, S65, S66) effectively performed. Also, the determining (S7) comprises proposing (S71, S72) user-selection of one of several operations according to the result of the tests, the selected operation being the determined operation at (S7).

The decision tree may be implemented in the system or in the program. Such a decision tree allows the performance of a comprehensive and optimized method for determining an operation easily. Alternatively, any branch or any combination of branches of the tree may be implemented. The method may indeed follow at least one branch of the decision tree, thus improving the design of a CAD modeled object at least in the case covered by the branch which is followed. All the operations used by the implemented tree are in any case provided by the CAD system.

Figure 9:
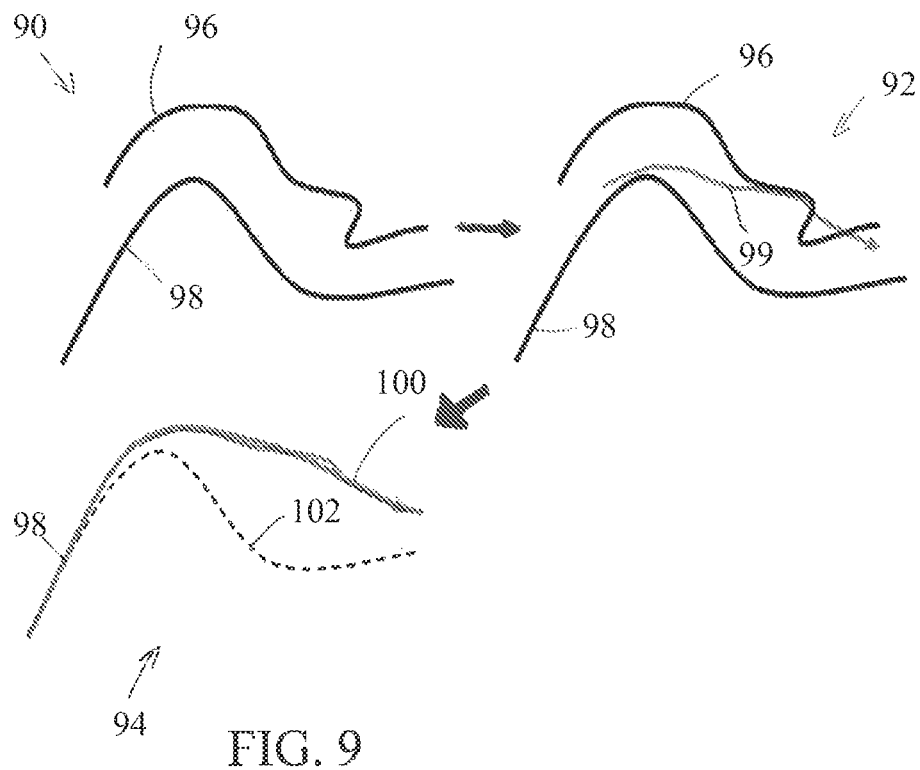
FIGS. 9-10 show examples of the method.
Figure 10:
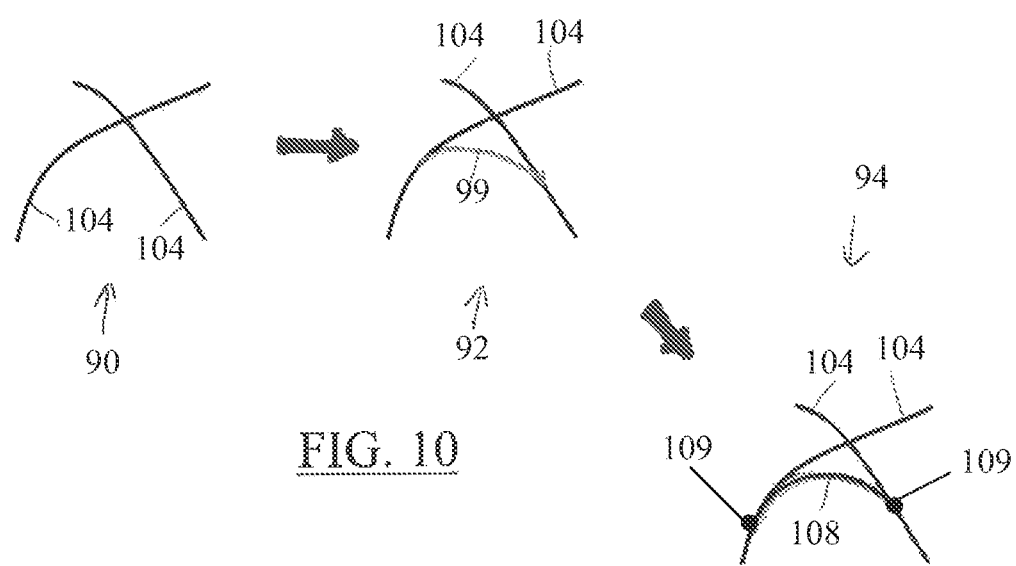

FIGS. 9-10 show an example of designing a modeled object. In both cases, a plurality of shapes which are 3D parametric curves (96, 98) or (104) are first displayed (S1) as 90. Then, the user sketches (S2, S3) a stroke 99. which is displayed as 92. Automatically, the method performs the edit operation and modifies the modeled object as displayed in 94.

FIG. 9 illustrates the selecting (S5). In the case of FIG. 9, the stroke 99 is sketched (S2, S3) near curve 98, which is thereby selected. As can be seen, the stroke has a direction, and it is the distance to the curves 96 and 98 from the beginning of the stroke which is computed (S45). As can be seen on display 94, curve 98 is in this example modified: new part 100 replaces old part 102 (which is represented in dotted line).

FIG. 10 illustrates the determining (S7) and the determining (S9). In this case, as represented from display 94, by sketching (S2, S3) a stroke 99 roughly representing a fillet between curves 104, the method automatically computes a fillet 108 with the correct radius and the correct contact points 109. The method thus allows a "what you get is what you see" behaviour.

The invention claimed is:
1. Computer-implemented method for designing a CAD modeled object comprising:

displaying at least one three-dimensional parametric shape;
user-interacting with the screen;
defining on a support at least one stroke corresponding to the user-interacting;
after the defining of the stroke, selecting a number of the three-dimensional parametric shapes;
evaluating a relative position of the stroke with the selected shape; and
determining a geometrical CAD operation to be performed based on the number and the relative position, the determining being among several possible CAD operations.

2. The method of claim 1, wherein evaluating a relative position comprises determining an intersection between the stroke and the selected shape.

3. The method of claim 2, wherein evaluating a relative position further comprises:
determining if the intersection is in an extremity portion of the selected shape,
determining if the intersection is in an extremity portion of the stroke,
determining if a tangent vector of the stroke and a tangent vector of the selected shape at the intersection are collinear, and/or
determining if a tangent vector of the stroke and a tangent vector of the selected shape at the intersection have a same sense.

4. The method of claim 3, wherein determining if the intersection is in an extremity portion of the selected shape is followed by:
determining if the intersection is in an extremity portion of the stroke when the number is 1 and the intersection is not in an extremity portion of the selected shape,
determining if a tangent vector of the stroke and a tangent vector of the selected shape at the intersection have a same sense when the number is 1 and the intersection is in an extremity portion of the selected shape, or
determining if a tangent vector of the stroke and a tangent vector of the selected shape at the intersection are collinear when the number is 2 and the intersection is not in an extremity portion of the selected shape.

5. The method of claim 4, wherein the operation is one of a cut operation, a translate operation, a rotate operation, an erase operation, an extrapol operation, a chamfer operation, a corner operation, a blend operation, a match operation, or a concaten operation.

6. The method of claim 5, wherein the operation is:
the cut operation when the number is 1, the intersection is not in an extremity portion of the selected shape, and the intersection is not in an extremity portion of the stroke;
one of several operations suggested, wherein the several suggested operations are the translate and the rotate operation, when the number is 1, the intersection is not in an extremity portion of the selected shape, and the intersection is in an extremity portion of the stroke;
the erase operation when the number is 1, the intersection is in an extremity portion of the selected shape, and the tangent vector of the stroke and the tangent vector of the selected shape at the intersection have a different sense;
the extrapol operation when the number is 1, the intersection is in an extremity portion of the selected shape, and the tangent vector of the stroke and the tangent vector of the selected shape at the intersection have a same sense;
the chamfer operation when the number is 2, the intersection is not in an extremity portion of the selected shape, and the tangent vector of the stroke and the tangent vector of the selected shape at the intersection are not collinear;
the corner operation when the number is 2, the intersection is not in an extremity portion of the selected shape, and the tangent vector of the stroke and the tangent vector of the selected shape at the intersection are collinear; or
one of several operations suggested, wherein the several suggested operations are the blend, the match and the concaten operation, when the number is 2 and the intersection is in an extremity portion of the selected shape.

7. The method of claim 6, wherein determining an operation comprises user-selecting one of the several operations suggested based on the number and the relative position.

8. The method of claim 7, wherein determining an intersection between the stroke and the selected shape comprises discretizing the stroke into stroke points, and determining shape points by discretizing the shape and then projecting the discretized shape on the support.

9. The method of claim 1, wherein the operation is one of a cut operation, a translate operation, a rotate operation, an erase operation, an extrapol operation, a chamfer operation, a corner operation, a blend operation, a match operation, or a concaten operation.

10. The method of claim 1, wherein determining an operation comprises user-selecting one of several operations suggested based on the number and the relative position.

11. The method of claim 2, wherein determining an intersection between the stroke and the selected shape comprises discretizing the stroke into stroke points, and determining shape points by discretizing the shape and then projecting the discretized shape on the support.

12. A CAD system comprising:
a memory for storing at least one three-dimensional parametric shape; and
a graphical user interface coupled with the memory and a processor and suitable for performing a computer-implemented method for designing a CAD modeled object comprising:
displaying at least one three-dimensional parametric shape;
user-interacting with the screen;
defining on a support at least one stroke corresponding to the user-interacting;
after the defining of the stroke, selecting a number of the three-dimensional parametric shapes;
evaluating a relative position of the stroke with the selected shape; and
determining a geometrical CAD operation to be performed based on the number and the relative position, the determining being among several possible CAD operations.

13. A non-transitory computer readable storage medium having recorded thereon a computer program comprising instructions for performing a computer-implemented method for designing a CAD modeled object comprising:
displaying at least one three-dimensional parametric shape;
user-interacting with the screen;
defining on a support at least one stroke corresponding to the user-interacting;
after the defining of the stroke, selecting a number of the three-dimensional parametric shapes;
evaluating a relative position of the stroke with the selected shape; and determining a geometrical CAD operation to be performed based on the number and the relative position, the determining being among several possible CAD operations.

* * * * *